(12) United States Patent
Parikh et al.

(10) Patent No.: US 7,230,284 B2
(45) Date of Patent: Jun. 12, 2007

(54) INSULATING GATE ALGAN/GAN HEMT

(75) Inventors: Primit Parikh, Goleta, CA (US);
Umesh Mishra, Santa Barbara, CA (US); Yifeng Wu, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/201,345

(22) Filed: Jul. 23, 2002

(65) Prior Publication Data
US 2003/0020092 A1 Jan. 30, 2003

Related U.S. Application Data

(60) Provisional application No. 60/307,546, filed on Jul. 24, 2001.

(51) Int. Cl.
*H01L 31/0328* (2006.01)
*H01L 31/0336* (2006.01)
*H01L 31/072* (2006.01)
*H01L 29/06* (2006.01)

(52) U.S. Cl. ............... 257/194; 257/192; 257/195; 257/24

(58) Field of Classification Search ............... 257/194, 257/192, 195, 24; 438/590, 285, 591
See application file for complete search history.

(56) References Cited

U.S. PATENT DOCUMENTS

| 5,192,987 | A |   | 3/1993  | Khan et al. ............... 257/183.1 |
| 5,569,937 | A | * | 10/1996 | Bhatnagar et al. ............ 257/77 |
| 5,929,467 | A | * | 7/1999  | Kawai et al. ............... 257/192 |
| 6,057,564 | A |   | 5/2000  | Rennie ...................... 257/99 |
| 6,140,169 | A |   | 10/2000 | Kawai et al. ............... 438/197 |
| 6,475,857 | B1 | * | 11/2002 | Kim et al. .................. 438/240 |
| 6,495,409 | B1 | * | 12/2002 | Manfra et al. .............. 438/216 |
| 6,690,042 | B2 | * | 2/2004  | Khan et al. ................. 257/192 |

OTHER PUBLICATIONS

Khan et al., AlGaN/GaN Metal Oxide Semiconductor Heterostructure Field Effect Transistor, IEEE Electron Device Letters, V.21, N2, Feb. 2000.*
The Electrical Engineering Handbook, 2d Edition, DORF, p. 994, (1997) CRC Press.

(Continued)

*Primary Examiner*—Shouxiang Hu
(74) *Attorney, Agent, or Firm*—Koppel, Patrick, Heybl & Dawson

(57) ABSTRACT

AlGaN/GaN HEMTs are disclosed having a thin AlGaN layer to reduce trapping and also having additional layers to reduce gate leakage and increase the maximum drive current. One HEMT according to the present invention comprises a high resistivity semiconductor layer with a barrier semiconductor layer on it. The barrier layer has a wider bandgap than the high resistivity layer and a 2DEG forms between the layers. Source and drain contacts contact the barrier layer, with part of the surface of the barrier layer uncovered by the contacts. An insulating layer is included on the uncovered surface of the barrier layer and a gate contact is included on the insulating layer. The insulating layer forms a barrier to gate leakage current and also helps to increase the HEMT's maximum current drive. The invention also includes methods for fabricating HEMTs according to the present invention. In one method, the HEMT and its insulating layer are fabricated using metal-organic chemical vapor deposition (MOCVD). In another method the insulating layer is sputtered onto the top surface of the HEMT in a sputtering chamber.

14 Claims, 5 Drawing Sheets

OTHER PUBLICATIONS

IEEE Electron Device Letters, vol. 18, No. 10, (Oct. 1997), p. 492.

Wu et al., "High Al Content AlGaN/GaN HEMTs With Very High Performance", IEDM-1999 Digest pp. 925-927, Washington, D.C. Dec. 1999.

IEEE Transactions on Electron Devices, vol. 48, No. 3/Mar. 2001, p. 581-585.

Kahn M A et al., "AlGaN/GaN Metal-Oxide-Semiconductor Heterostructure Field-Effect Transistors on SiC Substrates", Applied Physics Letters, American Institute of Physics. New York, US, vol. 77, No. 9, Aug. 2000, p. 1339-1341 XP000951319 ISSN: 0003-6951.

Lu W et al. "P-Type SiGe Transistors With Low Gate Leakage Using SiN Gate Dielectric", IEEE Electron Device Letters, IEEE, Inc., New York, US, vol. 20, No. 10, Oct. 1999, pp. 514-516, XP000890470, ISSN: 0741-3106.

Zhang N-Q et al., "High Breakdown GaN HEMT With Overlapping Gate Structure", IEEE Electron Device Letters, IEEE, Inc. New York, US, vol. 9, Sep. 2000, pp. 373-375, XP000954354, ISSN: 0741-3106.

Tilak, V. et al., "Effect of Passivation on AlGaN/GaN HEMT Device Performance", 2000 IEEE International Symposium on Compound Semiconductors. Proceedings of the IEEE 27th International Symposium on Compound Semiconductors (Cat. No. 00TH8498), 2000 IEEE International Symposium on Compound Semiconductors Proceedings of TH, p. 357-363, XP002239700, 2000, Piscataway, NJ, USA, IEEE, USA ISBN: 0-7803-6258-6.

Applied Physics Letters, vol. 77, No. 9, Aug. 2000, AlGaN/GaN Metal-Oxide-Semiconductor Heterostructure Field-Effect Transistors on SiC Substrates, Kahn et al.pp. 1339-1340.

\* cited by examiner

INSULATING GATE ALGAN/GAN HEMT

This application claims the benefit of provisional application Ser. No. 60/307,546 to Parikh et al., which was filed on Jul. 24, 2001.

This invention was made with Government support under Contract No. N00014-99-M-0148, awarded by the BMDO SBIR. The Government has certain rights in this invention.

BACKGROUND OF THE INVENTION

1. Field of the Invention

This invention relates to aluminum gallium nitride and gallium nitride based high electron mobility transistors.

2. Description of the Related Art

Microwave systems commonly use solid state transistors as amplifiers and oscillators which has resulted in significantly reduced system size and increased reliability. To accommodate the expanding number of microwave systems, there is an interest in increasing their operating frequency and power. Higher frequency signals can carry more information (bandwidth), allow for smaller antennas with very high gain, and provide radar with improved resolution.

Field effect transistors (FETs) and high electron mobility transistors (HEMTs) are common types of solid state transistors that are fabricated from semiconductor materials such as Silicon (Si) or Gallium Arsenide (GaAs). One disadvantage of Si is that it has low electron mobility (approximately 1450 $cm^2/V-s$), which produces a high source resistance. This resistance seriously degrades the high performance gain otherwise possible from Si based HEMTs. [CRC Press, *The Electrical Engineering Handbook*, Second Edition, Dorf, p.994, (1997)]

GaAs is also a common material for use in HEMTs and has become the standard for signal amplification in civil and military radar, handset cellular, and satellite communications. GaAs has a higher electron mobility (approximately 6000 $cm^2/V-s$) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing of gallium nitride (GaN) and aluminum gallium nitride (AlGaN) semiconductor materials have focused interest on the development of AlGaN/GaN based HEMTs. These devices can generate large amounts of power because of their unique combination of material characteristics including high breakdown fields, wide bandgaps (3.36 eV for GaN at room temperature), large conduction band offset, and high saturated electron drift velocity. The same size AlGaN/GaN amplifier can produce up to ten times the power of a GaAs amplifier operating at the same frequency.

U.S. Pat. No. 5,192,987 to Khan et al discloses AlGaN/GaN based HEMTs grown on a buffer and a substrate, and a method for producing them. Other HEMTs have been described by Gaska et al., "High-Temperature Performance of AlGaN/GaN HFET's on SiC Substrates," *IEEE Electron Device Letters*, Vol. 18, No 10, October 1997, Page 492; and Wu et al. "High Al-content AlGaN/GaN HEMTs With Very High Performance", *IEDM-1999 Digest* pp. 925–927, Washington D.C., December 1999. Some of these devices have shown a gain-bandwidth product ($f_T$) as high as 100 gigahertz (Lu et al. "AlGaN/GaN HEMTs on SiC With Over 100 GHz $f_t$ and Low Microwave Noise", *IEEE Transactions on Electron Devices*, Vol. 48, No. 3, March 2001, pp. 581–585) and high power densities up to 10 W/mm at X-band (Wu et al., "Bias-dependent Performance of High-Power AlGaN/GaN HEMTs", *IEDM*-2001, Washington D.C., Dec. 2–6, 2001).

Despite these advances, AlGaN/GaN based FETs and HEMTs have been unable to produce significant amounts of total microwave power with high efficiency and high gain. They produce significant power gain with DC gate drives, but with frequency step-ups as low as a millihertz to a few kilohertz, their amplification drops off significantly.

It is believed that the difference between AC and DC amplification is primarily caused by surface traps in the device's channel. Although the nomenclature varies somewhat, it is common to refer to an impurity or defect center as a trapping center (or simply trap) if, after capture of one type of carrier, the most probable next event is re-excitation.

At equilibrium, the traps donate electrons to the 2-dimensional electron gas (2-DEG) in HEMTs. Trapping levels located deep in a band gap are also slower in releasing trapped carriers than other levels located near the conduction of valence bands. This is due to the increased energy that is required to re-excite a trapped electron from a center near the middle of the band gap to the conduction band, compared to the energy required to re-excite the electron from a level closer to the conduction band.

$Al_xGa_{1-x}N$ (X=0~1) has a surface trap density comparable to the channel charge of the transistor with the traps in deep donor states with activation energy ranging from 0.7 to 1.8 eV (depending on X). During HEMT operation, the traps capture channel electrons. The slow trapping and de-trapping process degrades transistor speed, which largely degrades the power performance at microwave frequencies.

It is believed that the trap density of a AlGaN/GaN based HEMTs is dependent upon the surface and volume of the AlGaN barrier layer. Reducing the thickness of the AlGaN layer reduces the total trapping volume, thereby reducing the trapping effect during high frequency operation. However, reducing the thickness of the AlGaN layer can have the undesirable effect of increasing the gate leakage. During normal operation a bias is applied across the source and drain contacts and current flows between the contacts, primarily through the 2DEG. However, in HEMTs having thinner AlGaN layers, current can instead leak into the gate creating an undesirable current flow from the source to the gate. Also, the thinner AlGaN layer can result in a reduction in the HEMT's available maximum drive current.

SUMMARY OF THE INVENTION

The present invention seeks to provide an improved AlGaN/GaN HEMT that addresses the above problems by having a thin AlGaN layer to reduce trapping and also having additional layers to reduce gate leakage and increase the maximum drive current. The invention also discloses methods for manufacturing HEMTs with these characteristics.

One HEMT according to the present invention comprises a high resistivity semiconductor layer with a barrier semiconductor layer on it. The barrier layer has a wider bandgap than the high resistivity layer and a two dimensional electron gas forms between the barrier and high resistivity layers. Source and drain contacts are included that contact the barrier layer, with part of the surface of the barrier layer uncovered by the contacts. An insulating layer is included on the uncovered surface of the barrier layer. A gate contact is deposited on the insulating layer with the insulating layer forming a barrier to gate leakage current and also increasing the HEMT's maximum current drive.

The invention also includes methods for fabricating HEMTs according to the present invention. In one method, the active layers of the HEMT are formed on a substrate in a metal-organic chemical vapor deposition reactor. Source gasses are then fed into the reactor for "in-situ" formation of an insulating layer on the active HEMT's active layer. The HEMT can then be removed from the reactor for further processing.

Another method for fabricating HEMTs according to the present invention includes forming the active layers of a HEMT on a substrate. The substrate is then placed in a sputtering chamber where the insulating layer is sputtered onto the top surface of the HEMT active layers. The HEMT can then be removed from the sputtering chamber for further processing.

These and other further features and advantages of the invention would be apparent to those skilled in the art from the following detailed description, taking together with the accompanying drawings, in which:

DETAILED DESCRIPTION OF THE INVENTION

Figure 1:
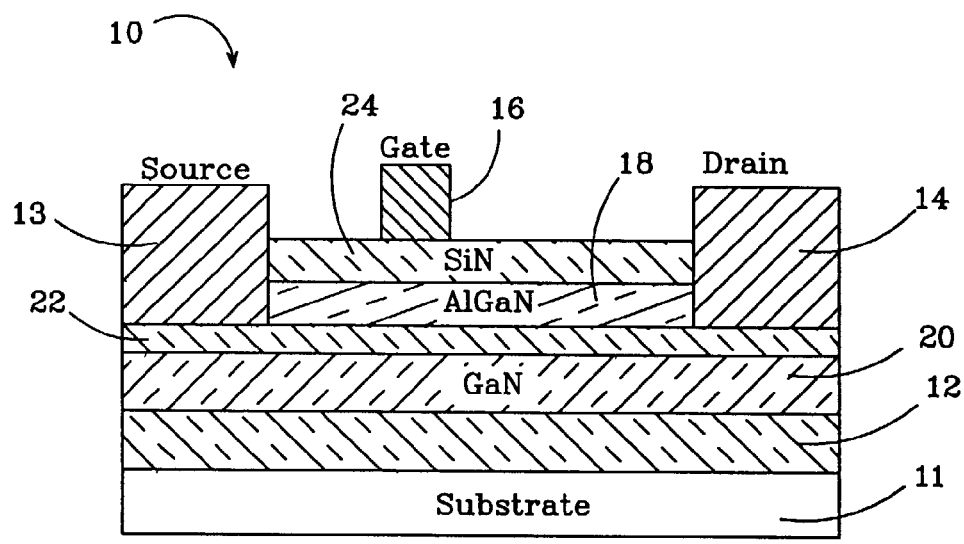
FIG. 1 is a sectional view of a AlGaN/GaN HEMT according to the present invention having an insulating layer on the AlGaN layer and a gate contact on the insulating layer.

FIG. 1 shows an AlGaN/GaN based HEMT 10 constructed in accordance with this invention. It comprises a substrate 11 that can be either sapphire ($Al_2O_3$) or silicon carbide (SiC), with the preferred substrate being a 4H polytype of silicon carbide. Other silicon carbide polytypes can also be used including 3C, 6H and 15R polytypes. An $Al_xGa_{1-x}N$ buffer layer 12 (where x in between 0 and 1) is included on the substrate 11 and provides an appropriate crystal structure transition between the silicon carbide substrate and the remainder of the HEMT 10. Many different materials can be used for the buffer layer 12 with a suitable material for a buffer layer on SiC being $Al_xGa_{1-x}N$, with x=1.

Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as is the case with some devices formed on sapphire). Also, the availability of semi insulating silicon carbide substrates provides the capacity for device isolation and reduced parasitic capacitance that make commercial devices possible. SiC substrates are available from Cree Research, Inc., of Durham, N.C. and methods for producing them are set forth in the scientific literature as well as in a U.S. Pat. Nos. Re. 34,861; 4,946,547; and 5,200,022.

The HEMT 10 includes a high resistivity layer 20 on the buffer layer 12 and a barrier layer 18 on said high resistivity layer 20 such that the high resistivity layer 20 is sandwiched between the barrier layer 18 and the buffer layer 12. The barrier layer 18 is typically about 0.1 to 0.3 micrometers thick and the barrier layer 18, high resistivity layer 20, and buffer layer 12, are preferably formed on the substrate 11 by epitaxial growth or ion implantation.

The HEMT also includes source and drain contacts 13, 14 that are on the surface of the high resistivity layer 20. The barrier layer 18 is disposed between the contacts 13 and 14, with each contacting the edge of the barrier layer. An insulating layer 24 is included on the barrier layer 18 between the contacts 13 and 14. In the embodiment shown, the insulating layer 24 covers the entire barrier layer 18, but in other embodiments (one described below) all of the barrier layer 18 is not covered. The layer 24 can be made of many different materials including but not limited to silicon nitride (SiN), aluminum nitride (AlN), silicon dioxide ($SiO_2$) or a combination incorporating multiple layers thereof.

The contacts 13 and 14 are usually separated by a distance in the range 1.5 to 10 micrometers for microwave devices. A rectifying Schottky contact (gate) 16 is located on the surface of the insulator layer 24 between the source and drain contacts 13 and 14, and it typically has a length in the range of 0.1 to 2 micrometers. The total width of the HEMT depends on the total power required. It can be wider than 30 millimeters, with the typical width being in the range of 100 microns to 6 millimeters.

The $Al_xGa_{1-x}N$ layer 18 has a wider bandgap than the GaN layer 20 and this discontinuity in energy band gaps results in a free charge transfer from the wider band gap to the lower band gap material. A charge accumulates at the interface between the two and creates a two dimensional electron gas (2DEG) 22 that allows current to flow between the source and drain contacts 13 and 14. The 2DEG has very high electron mobility which gives the HEMT a very high transconductance at high frequencies. The voltage applied to the gate 16 electrostatically controls the number of electrons in the 2DEG directly under the gate, and thus controls the total electron flow.

The source and drain contact 13 and 14, are preferably formed of alloys of titanium, aluminum, nickel and gold, and the gate 16 is preferably formed of titanium, platinum, chromium, nickel, alloys of titanium and tungsten, and platinum silicide. In one embodiment, the contacts comprise an alloy of nickel, silicon, and titanium that is formed by depositing respective layers of these materials, and then annealing them. Because this alloy system eliminates aluminum, it avoids unwanted aluminum contamination over the device surface when the anneal temperature exceeds the melting point of aluminum (660 degrees C.).

During operation, the drain contact 14 is biased at a specified potential (positive drain potential for an n-channel device) and the source is grounded. This causes current to flow through the channel and 2DEG, from the drain to the source contacts 13, 14. The flow of current is controlled by the bias and frequency potentials applied to the gate 16, which modulate the channel current and provide gain.

As described above, the trap density of the AlGaN layer 18 is dependent on the layer's volume and by reducing the thickness of the layer 18 the trapping density can also be reduced to decrease the trapping effect. However, reducing the thickness of the AlGaN layer increases gate leakage and reduces the devices maximum current drive.

By having the insulating layer between the gate 16 and the barrier layer 18, gate leakage of the HEMT is reduced. This has the direct impact of improving the long-term reliability of the device, since gate leakage is one of the sources of HEMT degradation. The turn-on voltage of the HEMT 10 is dependent upon the type of material used for the insulator layer 24 and the turn-on voltage can be as high as 3–4 volts. The HEMT 10 can then be operated in the accumulation mode with higher current level and higher input drive level. The insulator layer also serves as a natural passivant for the HEMT, which improves its reliability.

Figure 2:
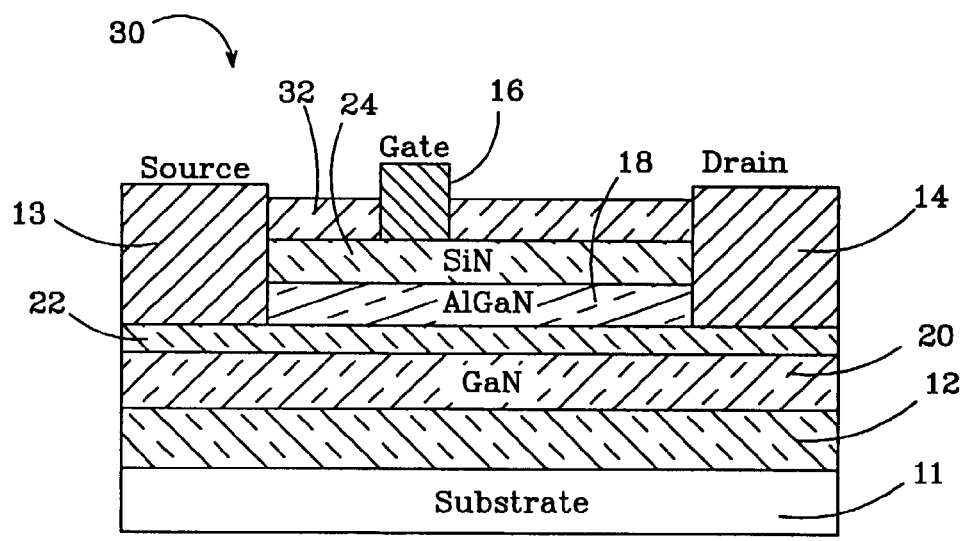
FIG. 2 is a sectional view of the HEMT in FIG. 1 with a dielectric layer on its surface.

FIG. 2 shows an AlGaN based HEMT 30 similar to the HEMT 10 in FIG. 1. The HEMT 30 has similar layers including a substrate 11, buffer layer 12, GaN layer 20, 2DEG 22, $Al_xGa_{1-x}N$ barrier layer 18 and insulating layer 24. The HEMT 30 also has source, gate and drain contacts 13, 14, 16, similar to those on the HEMT 10. The HEMT 30 includes an additional dielectric layer 32 disposed on the surface of the insulating layer 24 between the source, gate and drain contacts 13, 16, 14. The dielectric layer protects the HEMT from undesirable passivation, impurities and damage that can occur during handling. The dielectric layer can be made of many different materials or combinations of materials, with a suitable material being $Si_xN_y$.

The insulating layer 24 serves to reduce gate leakage and allow increased current drive by the section of the layer 24 that is sandwiched between the gate 16 and the barrier layer 18. The sections of the layer 24 that extend beyond the gate 16 help in protecting the surface of the barrier layer between the contacts, but do not help in reducing gate leakage or increasing current drive.

Figure 3:
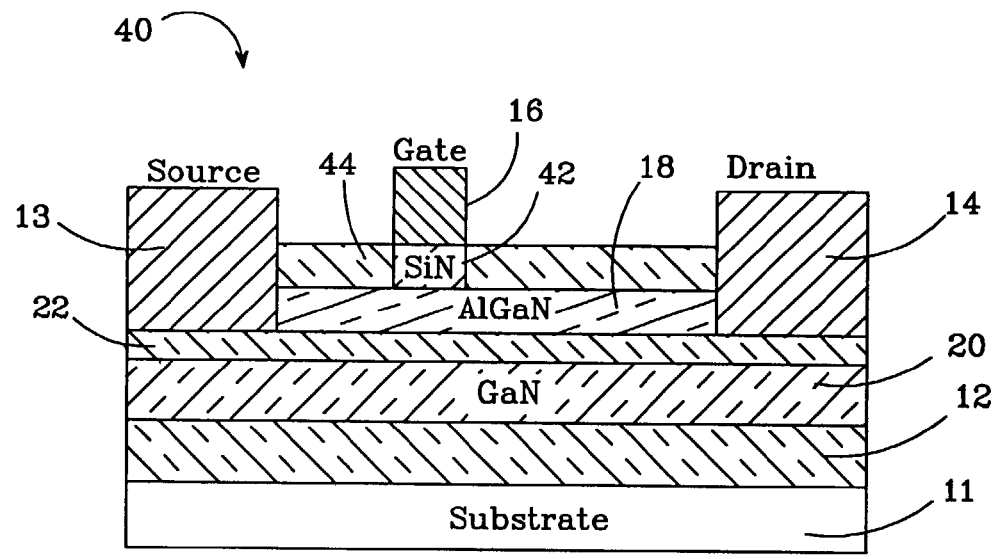
FIG. 3 is a sectional view of a AlGaN/GaN HEMT according to the present invention with the insulating layer only under the gate contact.

FIG. 3 shows another embodiment of a HEMT 40 according to the present invention similar to the HEMTs 10 and 30 in FIGS. 1 and 2. The HEMT 40 has similar layers including a substrate 11, buffer layer 12, GaN layer 20, 2DEG 22 and $Al_xGa_{1-x}N$ barrier layer 18. The HEMT 30 also has source, gate and drain contacts 13, 14 and 16, similar to those on the HEMTs 10 and 40. However, the insulating layer 42 in HEMT 40 is only included below the gate contact 16, such that the insulating layer is only sandwiched between the gate contact 16 and the barrier layer 18. The surface of the barrier layer 18 between the contacts 13, 14, 16, is uncovered by the insulating layer 42. It can remain uncovered or can include a layer of dielectic material 44 to help reduce the effects of trapping and to help reduce any undesirable passivation and damage to the HEMT's layers. It also helps to reduce the introduction of impurities into the HEMT's layers.

The dielectric layer is preferably silicon nitride ($Si_xN_y$), with silicon being the source of the donor electrons to reduce trapping. To be most effective the layer 32 and 44 should meet the following conditions. First, it should have a dopant that provides a high source of donor electrons. For silicon nitride, the layer should have a high percentage of Si. Although the applicant does not wish to be bound by any theory of operation, it is presently believed that electrons from the layer fill surface traps such that they become neutral and do not capture barrier layer electrons during operation.

Second, the energy level of the dopant should be higher than the energy level in the trap and for optimal results, the energy should be higher than the energy level of the barrier layer's conduction band edge. It is believed that this reduces the possibility of an electron from the gate metal giving to the donor states and prevents the trapping and de-trapping at that energy level. The layer will also work if the dopant's energy level is slightly below the energy level in the barrier layer's conduction band, but the higher its energy the better.

Third, there should be little or no damage to the device's surface and the forming of the dielectric layer should not increase the surface damage. It is believed that surface damage can create more surface traps. Fourth, the bond between the coating and the surface of the conducting channel should be stable under stress. If the bond is unstable, it is believed that the layer may fail under actual device operation when subjected to the stress created by increases in the electron field, voltage or temperature.

Low breakdown voltage can be experienced in HEMTs that have an insulating layer that is deposited in-situ using metal-organic chemical vapor deposition (MOCVD). Although applicants do not wish to be bound by any one theory, it is believed that this low breakdown voltage is attributable to the doping/degradation of the AlGaN barrier layer during growth of the SiN layer. The growth conditions such as the growth temperature of the SiN layer also affected the mobility of the HEMT's sheet charge. Lowering the growth temperature of the insulating layer resulted in less degradation of the HEMT, but also resulted in a reduced growth rate of the SiN.

Figure 4:
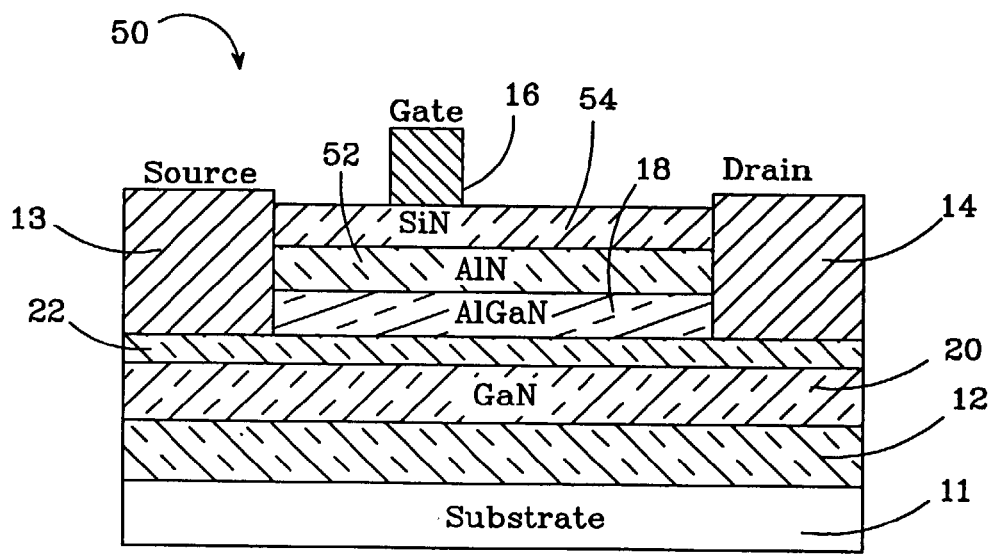
FIG. 4 is a sectional view of a AlGaN/GaN HEMT according to the present invention having a double insulating layers on the AlGaN layer and a gate contact on the insulating layers.

To allow for the growth of an insulating layer at a normal growth rate without doping or degrading the AlGaN barrier layer, a double insulating layer arrangement can be used instead of the single insulating layer. FIG. 4 shows a HEMT 50 that is similar to the HEMTS 10, 30 and 40 in FIGS. 1, 2 and 3. The HEMT 50 has a similar substrate 11, buffer layer 12, GaN layer 20, 2DEG 22, and $Al_xGa_{1-x}N$ barrier layer 18. The HEMT 30 also has similar source, gate and drain contacts 13, 14, 16. However, the HEMT 50 has a double layer arrangement is used instead of a single layer. The double layers include an AlN spacer layer 52 on the barrier layer 18 between the source and drain contacts 13, 14. A SiN insulating layer 54 is included on the AlN layer 52 with the gate contact 16 arranged on the insulating layer 54.

The AlN spacer layer 52 serves as a spacer or barrier between the SiN insulating layer 52 and the active AlGaN barrier layer 18. This spacer layer 52 prevents the doping/ degradation of the barrier layer 18 during growth of the SiN insulating layer 54 during normal growth conditions.

Other materials can be used for the spacer layer as long as the material prevents the doping and degradation of the AlGaN barrier layer 18 during deposition of the SiN insulating layer 54 at normal growth rates. Methods that allow for depositing the SiN insulating layer directly on the AlGaN layer without a spacer layer can also be used if doping and degradation can be avoided. The important aspect of these features of the invention is that the HEMTs low breakdown voltage is avoided.

Figure 5:
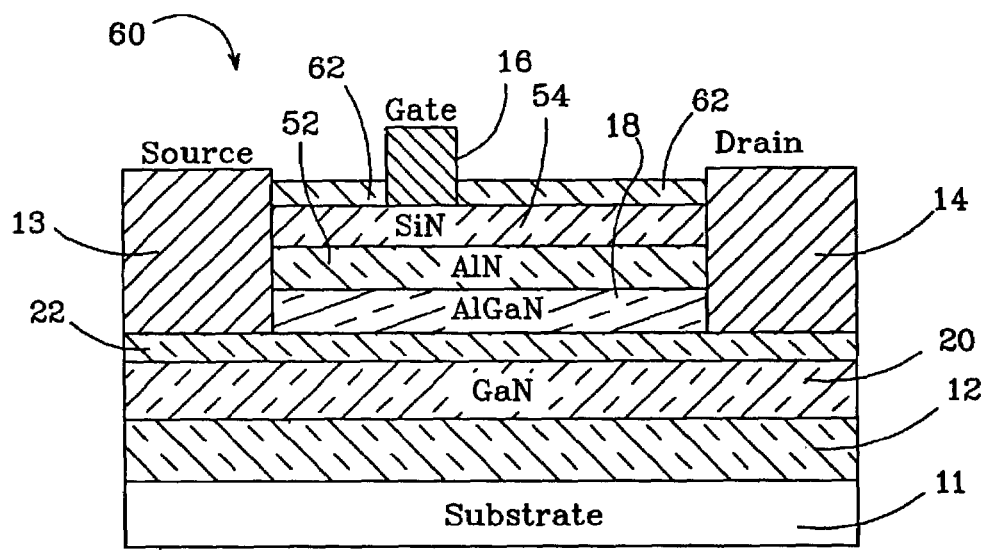
FIG. 5 is a sectional view of the HEMT in FIG. 4 with a dielectric layer on its surface.

FIG. 5 shows another HEMT 60 according to the present invention that is similar to the HEMT 50 of FIG. 4 having a similar substrate 11, buffer layer 12, GaN layer 20, 2DEG 22, $Al_xGa_{1-x}N$ barrier layer 18, AlN spacer layer 52 and SiN insulating layer 54. The HEMT 60 also has similar source, gate and drain contacts 13, 14 and 16. The HEMT 60 also includes a dielectric layer 62 over the exposed surface of the SiN insulating layer 54 between the contacts 13, 14, 16, similar to the dielectric layer 32 of the HEMT 30 in FIG. 2. Just as layer 32 in HEMT 30, the dielectric layer 54 helps protect the HEMT 60 from undesirable passivation, impurities and damage that can occur during handling. The dielectric layer can be made of many different materials or combinations of materials, with a suitable material being $Si_xN_y$.

Figure 6:
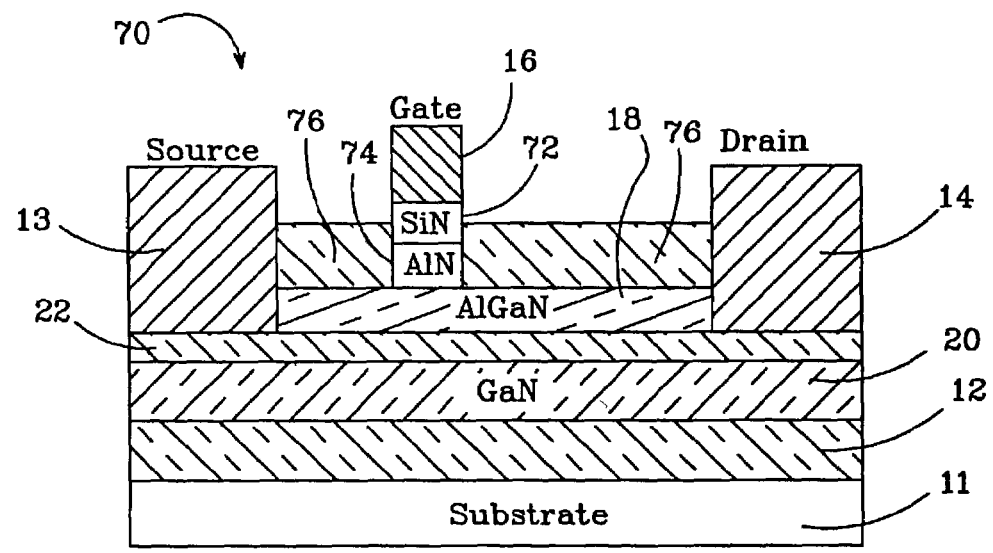
FIG. 6 is a sectional view of a AlGaN/GaN HEMT according to the present invention with the double insulating only under the gate contact.

FIG. 6 shows another HEMT 70 according to the present invention that, similar to the HEMT 40 in FIG. 3, which has an insulating layer only below the gate contact. The HEMT 70 has a similar substrate 11, buffer layer 12, GaN layer 20, 2DEG 22, $Al_xGa_{1-x}N$ barrier layer 18 and source, gate and drain contacts 13, 14 and 16. The HEMT's SiN insulating layer 72 and AlN spacer layer 74 are only included below the gate 16, such that both are sandwiched between the gate 16 and the barrier layer 18. In another embodiment (not shown) the spacer layer 74 can extend beyond the gate to cover the surface of the barrier layer between the contacts 13, 14 and 16.

The HEMT 70 also includes a dielectric layer 76 that as shown covers the surface of the barrier layer 18 between the contacts 13, 14 and 16. As with the dielectric layer 44 in the HEMT 40 of FIG. 3, the dielectic layer 76 helps reduce the effects of trapping and helps reduce the undesirable passivation and damage to the HEMT's layers. It also helps to reduce the introduction of impurities into the HEMT's layers. The dielectric layer 76 is preferably silicon nitride ($Si_xN_y$), with silicon being the source of the donor electrons to fill any traps. To be most effective the layer 76 should meet the four conditions described above for dielectric layer 44 of FIG. 3.

The active layers of the HEMTs described above are made from AlGaN/GaN, but they can also be made of other Group III nitride materials. Group III nitrides refer to those semiconductor compounds formed between nitrogen and the elements in Group III of the periodic table, usually aluminum (Al), gallium (Ga), and indium (In). The term also refers to ternary and tertiary compounds such as AlGaN and AlInGaN.

Methods of Manufacturing

The present invention also discloses methods for fabricating the HEMTs above with single or double insulating layer. The insulating layers can be deposited on the AlGaN/GaN semiconductor material using MOCVD, plasma chemical vapor deposition (CVD), hot-filament CVD or sputtering.

Figure 7:
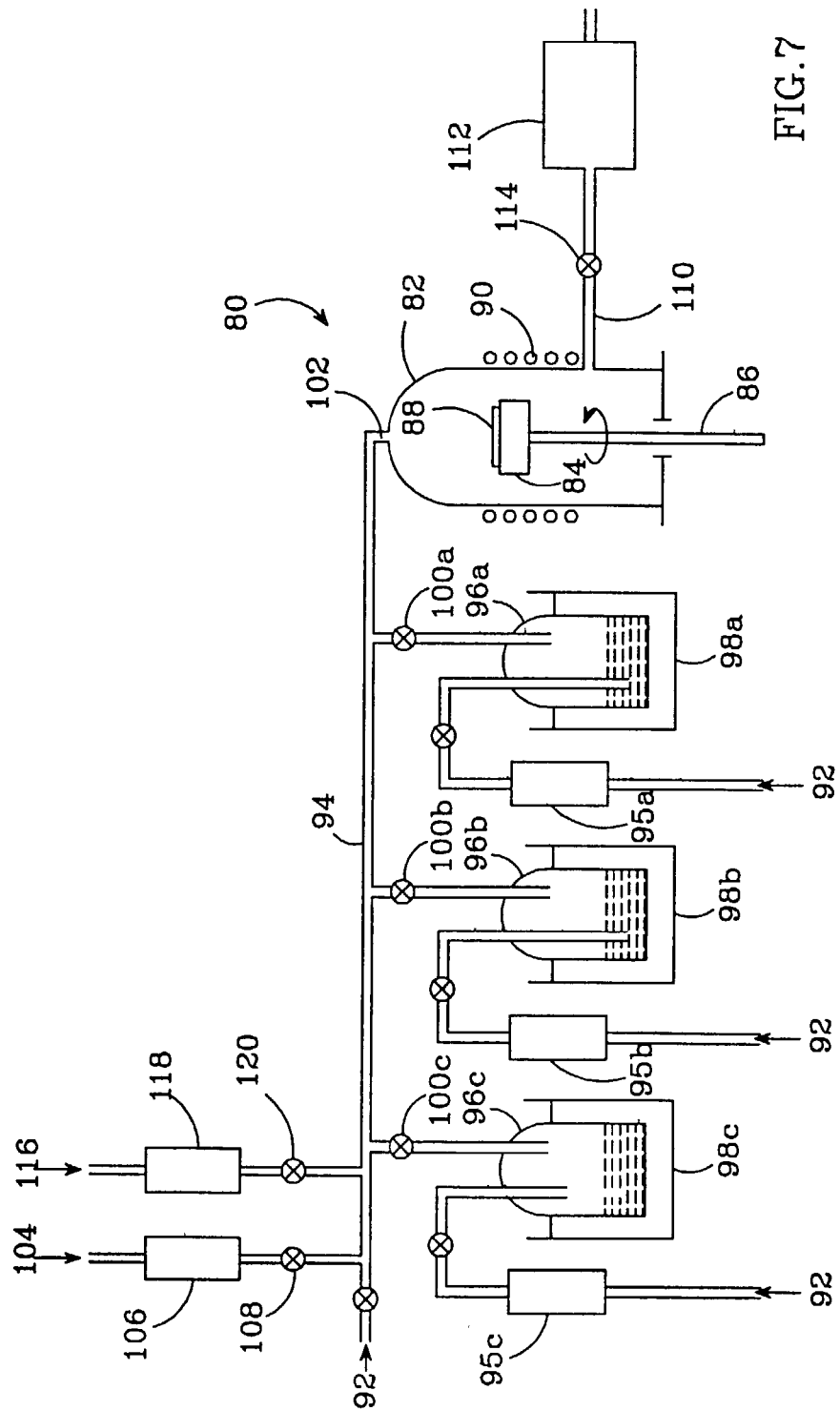
FIG. 7 is a simplified diagram of a metal-organic chemical vapor deposition (MOCVD) reactor used in a method according to the present invention for fabricating a HEMT.

FIG. 7 shows a MOCVD reactor 80 used in the new method to grow the AlGaN/GaN active layers on a substrate and to deposit the insulating layers. The reactor 80 comprises a reaction chamber 82 having growth platform 84 supported by a rotary shaft 86. In most applications a substrate 88 such as either sapphire ($Al_2O_3$) or silicon carbide (SiC) sapphire is disposed on the growth platform 84, although other substrates can also be used.

During growth, the platform 84 is heated by heater elements 90 to maintain substrate 88 at a predetermined temperature. The temperature is typically between 400 and 1200 degrees centigrade (° C.), but can be higher or lower depending on the type of growth desired. The heater elements 90 can be a variety of heating devices but is usually a radio frequency (RF) or resistance coil.

A carrier gas 92 is supplied to a gas line 94, the carrier gas being hydrogen or nitrogen. The carrier gas 92 is also supplied through mass flow controllers 95a, 95b, 95c, to respective bubblers 96a, 96b, 96c. Bubbler 96a has a growth compound, typically an alkylated compound having a methyl or ethyl group, e.g. trimethyl gallium TMG), trimethyl aluminum (TMA) or trimethyl indium (TMI). Bubblers 96b and 96c may also contain a similar metalorganic compound to be able to grow an alloy of a Group III compound. The bubblers 96a, 96b, 96c are typically maintained at a predetermined temperature by constant temperature baths 98a, 98b, 98c to ensure a constant vapor pressure of the metal organic compound before it is carried to the reaction chamber 82 by the carrier gas 92.

The carrier gas 92 which passes through bubblers 96a, 96c, 96c is mixed with the carrier gas 92 flowing within the gas line 94 by opening the desired combination of valves 100a, 100b, 100c. The mixed gas is then introduced into the reaction chamber 82 through a gas inlet port 102 formed at the upper end of the reaction chamber 82.

A nitrogen containing gas 104 such as ammonia is supplied to the gas line 94 through a mass flow controller 106. The flow of nitrogen containing gas is controlled by valve 108. If the carrier gas 92 is mixed with the nitrogen containing gas 104, and the TMG vapor within the gas line 94 is introduced into the reaction chamber 82, the elements are present to grow gallium nitride on the substrate 88 through thermal decomposition of the molecules in the TMG and ammonia containing gas.

To dope alloys of gallium nitride on the substrate 88, one of the bubblers 96a, 96b, 96c not being used for the TMG is used for a dopant material, which is usually Magnesium (Mg) or Silicon (Si), but can be other material such as beryllium, calcium, zinc, or carbon. Bubbler 96b or 96c is used for an alloy material such as boron, aluminum, indium, phosphorous, arsenic or other materials. Once the dopant and alloy are selected and the appropriate valve 100a, 100b, 100c is opened to allow the dopant to flow into gas line 94 with the gallium and nitrogen containing gas 104, the growth of the doped layer of gallium nitride takes place on substrate 88.

The gas within the reaction chamber 82 can be purged through a gas purge line 110 connected to a pump 112 operable under hydraulic pressure. Further, a purge valve 114 allows gas pressure to build up or be bled off from the reaction chamber 82.

The growth process is typically stopped by shutting off the gallium and dopant sources by closing valves 100a and 100b, and keeping the nitrogen containing gas and the carrier gas flowing. Alternatively, the reaction chamber 82 can be purged with a gas 116 that can be controlled through a mass flow controller 118 and valve 120. The purge is aided by opening valve 114 to allow the pump 112 to evacuate the reaction chamber 82 of excess growth gasses. Typically, the purge gas 116 is hydrogen, but can be other gasses. Turning off power to the heater elements 90 cools the substrate 88.

In one method according to the present invention, the application of the insulating layer/layers occurs after growth of the AlGaN/GaN semiconductor material and prior to or during cooling of the reaction chamber 82 (referred to as in-situ). Following growth of the semiconductor material in a reactor chamber 82, the flow of undesired growth gasses is discontinued by closing the appropriate combination of valves 100a, 100b, 100c. A short purge of the reactor may be completed to remove the undesirable gasses as described above. Gasses are then flowed into the reactor to deposit the insulating layer(s) and in a preferred method, the gasses used for the insulating layer(s) are provided from typical MOCVD sources. When depositing a $Si_3N_4$ insulating layer on the AlGaN/GaN semiconductor material, disilane ($Si_2H_6$) and ammonia ($NH_6$) are introduced into the reactor chamber 82, through gas line 94. The molecules are now present to deposit the $Si_3N_4$ through thermal decomposition on the AlGaN/GaN material. When depositing double insulating layers, the appropriate gasses are introduced into the chamber to form the AlN layer prior to forming the $Si_3N_4$ layer.

In those embodiments of the HEMT having a dielectric layer, the dielectric layer can also be deposited in-situ. Examples of some of the compounds that can be used in the dielectric layer include Si, Ge, $MgO_x$, $MgN_x$, ZnO, $SiN_x$, $SiO_x$, $ScO_x$, $GdO_x$ and alloys thereof. Multiple layers and repeated stacks of layers of suitable materials can be used as barrier layers as well, such as $SiN_x$/Si, $MgN_x$/$SiN_x$ or $MgN_x$/$MgO_x$. The different barrier layers can be formed from the following source gasses: Si from silane or disilane, Ge from germane, $MgN_x$ from cyclopentadienyl magnesium or methyl-cyclopentadienyl magnesium and ammonia, MgO from cyclopentadienyl magnesium or methyl-cyclopentadienyl magnesium and nitrous oxide, ZnO from dimethyl zinc or diethyl zinc and nitrous oxide or water, $SiN_x$ from silane or disilane and ammonia or nitrous oxide, and $SiO_x$ formed from silane or disilane and nitrous oxide.

After the insulating and dielectric layers are deposited the semiconductor material can be cooled in the reaction chamber 82. The semiconductor material can then be removed from the cooled reaction chamber 82. When the structure is ready for additional processing such as metalization, the portion of the layers can be removed by a number of different methods including but not limited to wet chemical hydrofluoric acid (HF) etching, reactive ion etching, or plasma etching.

Figure 8:
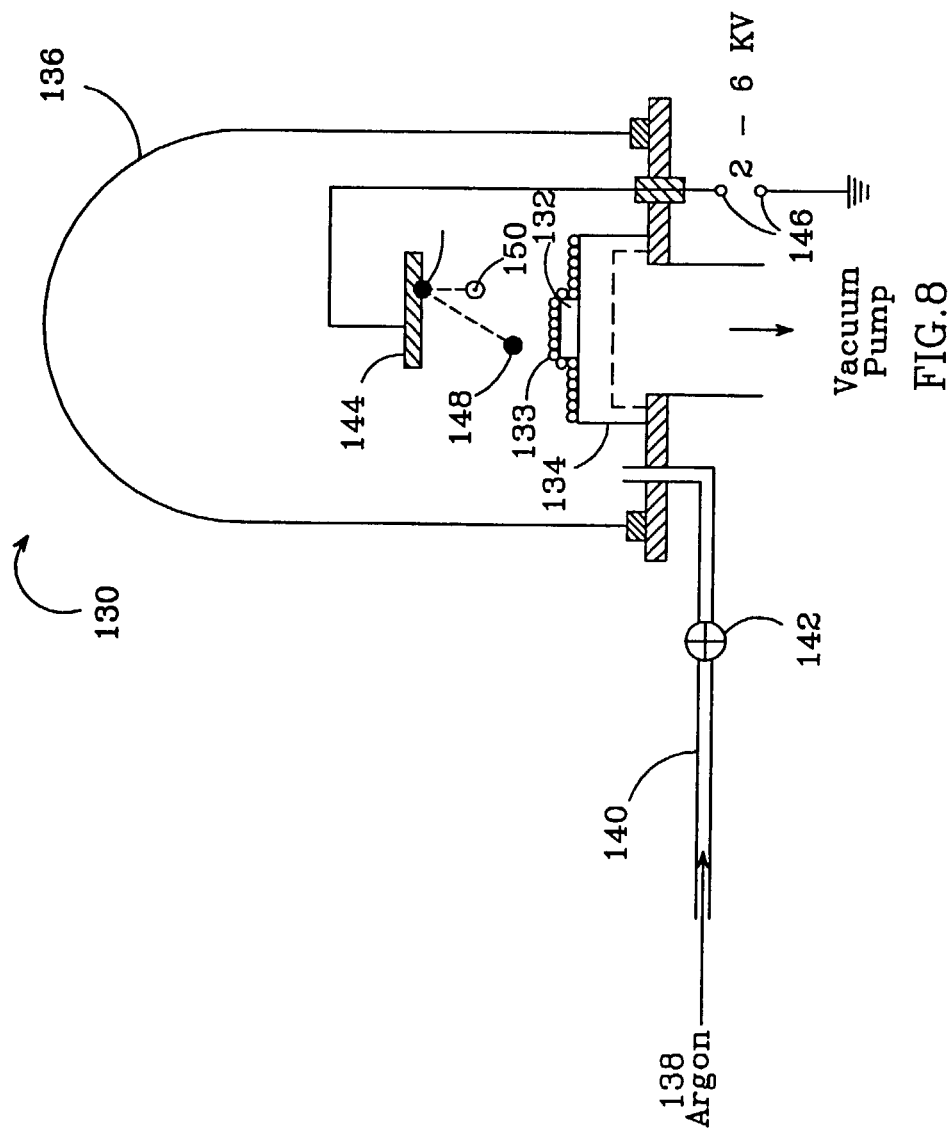
FIG. 8 is a simplified diagram of a sputtering chamber used in a method according to the present invention for fabricating a HEMT.

Another method for depositing the insulating layers according to the present invention is through sputtering. FIG. 8 shows a simplified sputtering chamber 130 that can be used to deposit material on a substrate. In operation, a semiconductor device 132 is placed on an anode 134. The chamber 136 is then evacuated and an inert gas 138 such as argon is fed into gas line 140 and bled through the valve 142 to maintain a background pressure. A cathode 144 made of the material to be deposited on the substrate/device, is positioned within the chamber 136. With the application of a high voltage 146 between the electrodes, the inert gas is ionized and the positive ions 148 excel to the cathode 144. On striking the cathode 144, they collide with the cathode atoms 150, giving them sufficient energy to be ejected. The sputtered cathode atoms 150 travel through space, eventually covering the anode 134 and the semiconductor device 132 with a coating 133 from the sputtered atoms 150.

Other sputtering units can be more complex and detailed, but they work on much the same basic physical mechanisms. Using the more complex sputtering systems, it is possible to sputter and deposit a range of metals and dielectric layers.

The sputtering method can be used to deposit the insulating layers on an AlGaN/GaN HEMT. The HEMT is first formed on a semiconductor wafer by a process such as MOCVD. The wafer is then cleaned (rinsing with $NH_4OH$:$H_2O$ (1:4) for approximately 10 to 60 seconds) and the device 132 is then loaded into a sputtering chamber 136 having a silicon source at the cathode 144. The $Si_xN_y$ insulating layer is deposited on the wafer by sputtering. The sputtering process includes the specific steps of pumping down the chamber to a low pressure of about $3 \times 10^{-7}$ Torr. Using a source gas having a flow of 20–100 sccm and a pressure of 5–10 mTorr the plasma is then started with RF power of 200–300W for about 2 minutes. This bombards the silicon at the cathode 144, cleaning its surface. The sputtering conditions are then changed such that the argon gas flow is 10–12 sccm, the nitrogen gas flow of 8–10 scam, chamber pressure of 2.5–5 mTorr, and the RF power of 200–300W. This condition is maintained for 2 minutes to sputter the Si cathode 144. The sputtered silicon reacts with the nitrogen and the resulting silicon nitride deposits on the device 132.

After sputtering, the next step 130 is to turn off the nitrogen gas and turn up the argon gas flow to 20–100 scam for 2 minutes to clean the Si surface. All gas and power are then turned off and the chamber is allowed to cool down for five minutes and vent. The device 132 can then be removed from the sputtering chamber. The layers of the device can then be etched. Windows can then be in the device layers for the source, gate and drain contacts, using different methods including but not limited to wet chemical hydrofluoric acid (HF) etching, reactive ion etching, or plasma etching.

Alternatively, the contacts and gate could be deposited on the device before depositing the insulating layer in the sputtering chamber 130. The dielectric layer over the contacts and gate could then be etched to allow for the connection of leads.

Although the present invention has been described in considerable detail with reference to certain preferred configurations thereof, other versions are possible. The insulating layer can be used on HEMTs from different material systems and on other semiconductor devices. The insulating layer can also be applied using many different methods beyond those mentioned above, including PECVD, Electron Beam Deposition, Inductively Coupled Plasma and ICP Deposition. Therefore, the spirit and scope of the appended claims should not be limited to the preferred versions described in the specification.

We claim:

1. A high electron mobility transistor (HEMT), comprising:
    a GaN based high resistivity semiconductor layer;
    a GaN based barrier semiconductor layer on said high resistivity semiconductor layer, said barrier layer having a wider bandgap than said high resistivity semiconductor layer;
    a two-dimensional electron gas between said barrier layer and said high resistivity semiconductor layer;
    respective source and drain contacts directly contacting said barrier layer and said GaN based high resistivity semiconductor layer;
    an insulating layer positioned on said barrier layer; and
    a gate contact on said insulating layer, said insulating layer forming a barrier against gate leakage current and increasing the HEMT's maximum current drive, wherein said insulating layer comprises a layer of silicon nitride and a layer of aluminum nitride, said aluminum nitride layer providing a spacer between said barrier layer and said silicon nitride insulating layer to reduce doping and degradation of said barrier layer during growth of said silicon nitride layer.

2. The HEMT of claim 1, further comprising a dielectric layer covering the exposed surfaces of said insulating layer between said contacts.

3. A high electron mobility transistor (HEMT), comprising:
    a Group-III nitride based high resistivity semiconductor layer;

a Group-III nitride barrier semiconductor layer on said high resistivity semiconductor layer, said barrier layer having a wider bandgap then said high resistivity semiconductor layer;

a two-dimensional electron gas between said barrier layer and said high resistivity semiconductor layer;

respective source and drain contacts directly contacting said barrier layer and said Group-III nitride based high resistivity semiconductor layer;

an insulating layer positioned on said barrier layer; and a gate contact on said insulating layer, said insulating layer forming a barrier against gate leakage current and increasing the HEMT's maximum current drive wherein said insulating layer covers the surface of said barrier layer between said source and drain contacts and wherein said insulating layer comprises a AlN layer and a SiN layer, with said AlN layer sandwiched between said barrier layer and said SiN layer to protect said barrier layer during formation of said SiN layer.

4. The HEMT of claim 3, further comprising a dielectric layer on the surface of said insulating layer between said contacts.

5. A high electron mobility transistor (HEMT), comprising:
a GaN semiconductor layer that has a high resistivity;
a AlGaN semiconductor barrier layer on said GaN layer, said AlGaN layer having a wider bandgap than said GaN layer;
a two dimensional electron gas (2-DEG) between said AlGaN barrier layer and said GaN layer;
source and drain contacts directly contacting said AlGaN layer and said GaN semiconductor layer;
a gate contact electrically coupled with said 2-DEC through said barrier layer; and
a means for forming a barrier against gate leakage current between said gate contact and said barrier layer, said barrier also increasing the HEMT's maximum current drive, wherein said means for forming a barrier comprises double insulating layers each made from a different material, on said barrier layer with said gate contact on said double insulating layers, the first layer of said double insulating layers providing a spacer between said barrier layer and the second layer of said double insulating layers to prevent doping or degradation to said barrier layer when said second layer of said double insulating layers is deposited, wherein said double insulating layers comprise a layer of AlN and a layer of SiN, said AlN layer serving as said spacer between said barrier layer and said SiN layer.

6. The HEMT of claim 5, further comprising a dielectric layer on the surfaces of said double insulating layers and barrier layer between said contacts.

7. A transistor, comprising:
a Group-III nitride high resistivity semiconductor layer;
a Group-III nitride barrier semiconductor layer on said high resistivity semiconductor layer;
source and drain contacts directly contacting said barrier layer and said Group-III nitride high resistivity semiconductor layer;
an insulating layer positioned on said barrier layer; and
a gate contact on said insulating layer, said insulating layer forming a barrier against gate leakage current, wherein said insulating layer comprises multiple layers comprising a layer of silicon nitride on a layer of aluminum nitride, wherein said aluminum nitride layer serves as a spacer to minimize doping and degradation of said barrier layer during formation of the rest of said multiple layers.

8. The transistor of claim 7, wherein said insulating layer increases the maximum current drive of said transistor.

9. The transistor of claim 7, wherein said barrier semiconductor layer has a thickness that allows said transistor to produce efficient gain at microwave frequencies.

10. The transistor of claim 7, wherein said aluminum nitride layer is sandwiched between said barrier layer and said silicon nitride layer.

11. The transistor of claim 7, further comprising a dielectric layer on the surface of said insulating layer between said contacts.

12. The transistor of claim 7, wherein said barrier layer has a wider bandgap than said high resistivity semiconductor layer, said transistor further comprising a two-dimensional electron gas between said barrier layer and said high resistivity semiconductor layer.

13. The transistor of claim 7, comprising a high electron mobility transistor (HEMT).

14. The transistor of claim 7, comprising a field effect transistor (FET).

* * * * *